(12) United States Patent
Kasai et al.

(10) Patent No.: US 10,960,666 B2
(45) Date of Patent: Mar. 30, 2021

(54) ELEMENT SUBSTRATE, LIQUID DISCHARGE HEAD, AND PRINTING APPARATUS

(71) Applicant: CANON KABUSHIKI KAISHA, Tokyo (JP)

(72) Inventors: Ryo Kasai, Tokyo (JP); Kazuhiro Yamada, Yokohama (JP); Takuro Yamazaki, Inagi (JP); Yoshiyuki Nakagawa, Kawasaki (JP); Toru Nakakubo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/708,253

(22) Filed: Dec. 9, 2019

(65) Prior Publication Data

US 2020/0198346 A1 Jun. 25, 2020

(30) Foreign Application Priority Data

Dec. 19, 2018 (JP) .............................. JP2018-237621

(51) Int. Cl.
*B41J 2/14* (2006.01)
*H01L 23/34* (2006.01)
*H01L 29/417* (2006.01)
*H01L 29/423* (2006.01)
*H01L 29/78* (2006.01)

(52) U.S. Cl.
CPC ........ *B41J 2/14088* (2013.01); *H01L 23/345* (2013.01); *H01L 29/41758* (2013.01); *H01L 29/4238* (2013.01); *H01L 29/7817* (2013.01)

(58) Field of Classification Search
CPC .. B41J 2/04523; B41J 2/04541; B41J 2/0458; B41J 2/14072; B41J 2/14088; B41J 2202/12; H01L 23/345; H01L 29/41758; H01L 29/4238; H01L 29/7817
See application file for complete search history.

(56) References Cited

U.S. PATENT DOCUMENTS

| 9,283,590 | B2 * | 3/2016 | Govyadinov | .......... B41J 2/1404 |
|---|---|---|---|---|
| 2013/0155152 | A1 * | 6/2013 | Govyadinov | ........... F04B 19/24 347/54 |
| 2014/0362143 | A1 * | 12/2014 | Govyadinov | .............. B41J 2/15 347/85 |
| 2017/0313063 | A1 * | 11/2017 | Govyadinov | ............ B41J 2/175 |

FOREIGN PATENT DOCUMENTS

WO 2011/146069 A 11/2011

* cited by examiner

*Primary Examiner* — Anh T Vo
(74) *Attorney, Agent, or Firm* — Canon U.S.A., Inc. IP Division

(57) ABSTRACT

According to an embodiment of the present disclosure, to improve a layout efficiency of an element substrate to be integrated in a printhead and reduce a production cost of the element substrate, a driving method and a size of a first driver transistor used for driving a first heater for ink circulation and a driving method and a size of a second driver transistor used for driving a second heater for discharging ink to print are optimized, respectively. More specifically, the first driver transistor and the second driver transistor have multi-finger configurations, gate widths of the multi-finger configurations are equal to each other, and the number of fingers forming each first driver transistor is different from the number of fingers forming each second driver transistor.

14 Claims, 11 Drawing Sheets

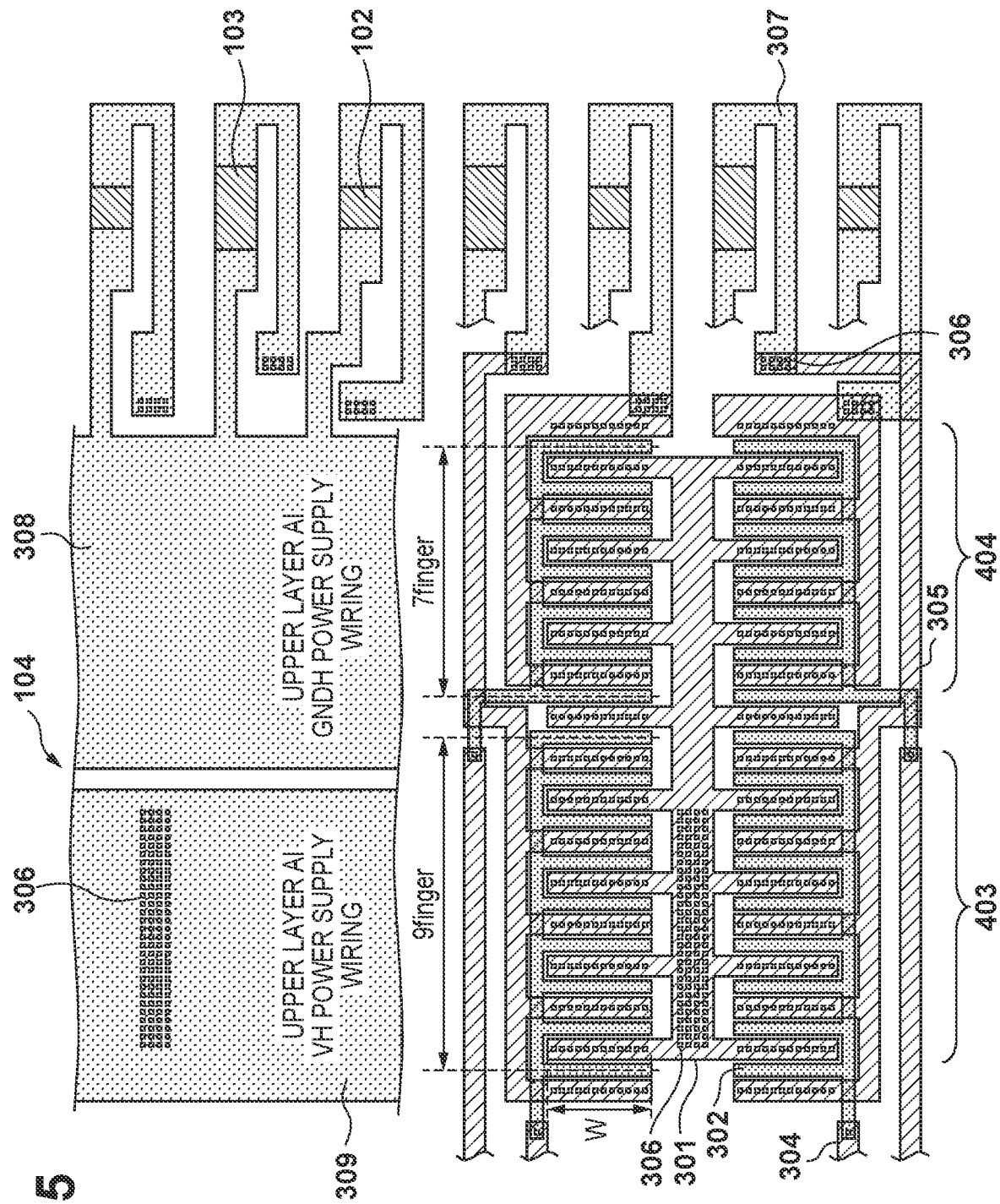

ELEMENT SUBSTRATE, LIQUID DISCHARGE HEAD, AND PRINTING APPARATUS

BACKGROUND OF THE INVENTION

Field of the Invention

The present disclosure relates to an element substrate, a liquid discharge head, and a printing apparatus, and particularly to, for example, a printing apparatus in which a liquid discharge head incorporating an element substrate has been applied as a printhead for performing printing in accordance with an inkjet method.

Description of the Related Art

In a liquid discharge head used in a liquid discharge apparatus that discharges a liquid such as ink or the like, the viscosity of the liquid in the vicinity of each orifice, from which the liquid is discharged, increases as a volatile component contained in the liquid evaporates from the orifice. This can change the discharge speed of droplets to be discharged and influence the landing accuracy of the liquid droplets onto a target object. Particularly, in a case in which there is a long downtime after the discharge operation, the viscosity of the liquid will increase noticeably and cause solid components of the liquid adhere to portions in the vicinity of each orifice. These solid components may increase the fluid resistance of the liquid, thus leading to discharge failure in some cases.

As a countermeasure to this phenomenon of a viscosity increase, there is known a method of causing a fresh liquid to flow through each orifice in the liquid chamber. As a method for causing the liquid to flow, there is known a method in which the liquid in the liquid discharge head is circulated by a differential pressure method. In addition, there is also known a method that uses the fluid intake from the side of the fluid channel which has a low fluid resistance when liquid refilling is performed after an auxiliary resistor, arranged at a position asymmetrical to the fluid resistance in the fluid channel, has performed a heating and bubbling operation (see International Publication No. 2011/146069).

In International Publication No. 2011/146069, there is disclosed a configuration in which a heater serving the role of a pump for fluid intake and a heater (discharge heater) for discharging ink are individually arranged. In a case in which these heaters are to be arranged in the same array, if a large-area discharge heater is arranged to ensure the ink discharge performance, a narrow pump heater will need to be arranged due to constraints from the thickness of the nozzle wall, the width of the fluid channel, and the like. In such a configuration, the heater current at the time of an ink discharge operation becomes larger than the heater current at the time of a pump driving operation. On the other hand, if a sufficient pumping capability is to be ensured, a large-area pump heater will need to be arranged to increase the bubbling volume, and the pump heater will need to be supplied with a larger heater current than that supplied to the discharge heater.

In this manner, in the related art described above, if the sizes of the drivers that are to drive the respective heaters are designed to be identical in a configuration in which the heaters supplied with different current values from each other are arranged in one array, the driver size will need to be designed so as to match the size of the driver which requires the larger supply current. As a result, the semiconductor chip that serves as the head chip will need to be enlarged, thus degrading the component layout efficiency and further increasing the manufacturing cost problematically.

SUMMARY OF THE INVENTION

Accordingly, the present disclosure is conceived as a response to the above-described disadvantages of the conventional art.

For example, an element substrate, a liquid discharge head, and a printing apparatus according to this disclosure are capable of improving the component layout efficiency and being manufactured at a low cost.

According to one aspect of the present disclosure, there is provided an element substrate including, a plurality of first heaters arrayed in a predetermined direction, a plurality of second heaters arranged alternatingly with the plurality of first heaters, along in the predetermined direction of the plurality of first heaters, a plurality of first driver transistors configured to drive the plurality of first heaters, and a plurality of second driver transistors configured to drive the plurality of second heaters, wherein each of the plurality of first heaters and each of the plurality of second driver transistors have multi-finger configurations, gate widths of the multi-finger configurations are equal to each other, and a number of fingers forming each of the plurality of first driver transistor is different from a number of fingers forming each of the plurality of second driver transistor.

According to another aspect of the present disclosure, there is provided a liquid discharge head including, an element substrate having the above arrangement, a plurality of orifices configured to discharge a liquid, a common supply port configured to supply the liquid to each of the plurality of orifices, a plurality of first fluid channels provided in correspondence with the plurality of orifices and configured to take in the liquid from the common supply port, a plurality of second fluid channels provided in correspondence with the plurality of orifices and configured to return the liquid to the common supply port, wherein each of the plurality of first fluid channels is arranged with a corresponding one of the plurality of first heaters, each of the plurality of second fluid channels is arranged with a corresponding one of the plurality of second heaters and a corresponding one of the plurality of orifices, and each of the plurality of second heaters is further arranged immediately below the corresponding one of the plurality of orifices, and the liquid is circulated and discharged from the plurality of orifices via the common supply port, the first fluid channels, and the second fluid channels.

According to still another aspect of the present disclosure, there is provided a printing apparatus that performs printing by discharging ink from a printhead to a print medium, wherein a liquid discharge head having the above arrangement is used as the printhead and a liquid discharged from the liquid discharge head is the ink.

The disclosure is particularly advantageous since the layout configuration efficiency is improved by changing the sizes of first and second driver transistors that drive first and second heaters, respectively, and the manufacturing cost of the element substrate is reduced by downsizing the element substrate.

Further features of the present disclosure will become apparent from the following description of exemplary embodiments (with reference to the attached drawings).

BRIEF DESCRIPTION OF THE DRAWINGS

FIG. 5 is a layout view showing a detailed circuit configuration of a portion of discharge heaters, pump heaters, and driver transistors according to the first embodiment of the present disclosure;

DESCRIPTION OF THE EMBODIMENTS

Exemplary embodiments of the present disclosure will now be described in detail in accordance with the accompanying drawings.

In this specification, the term "printing" (to be also referred to as "print" hereinafter) not only includes the formation of significant information such as characters and graphics, regardless of whether they are significant or insignificant. Furthermore, it broadly includes the formation of images, figures, patterns, and the like on a print medium, or the processing of the medium, regardless of whether they are so visualized as to be visually perceivable by humans.

In addition, the term "print medium" not only includes a paper sheet used in common printing apparatuses, but also broadly includes materials, such as cloth, a plastic film, a metal plate, glass, ceramics, wood, and leather, capable of accepting ink.

Furthermore, the term "ink" (to also be referred to as a "liquid" hereinafter) should be broadly interpreted to be similar to the definition of "printing (print)" described above. That is, "ink" includes a liquid which, when applied onto a print medium, can form images, figures, patterns, and the like, can process the print medium, or can process ink (for example, solidify or insolubilize a coloring material contained in ink applied to the print medium).

Further, a "nozzle" (to also be referred to as a "print element") generically means an orifice or a liquid channel communicating with it, and an element for generating energy used to discharge ink, unless otherwise specified.

An element substrate for a printhead (head substrate) used below means not merely a base made of a silicon semiconductor, but a configuration in which elements, wirings, and the like are arranged.

Further, "on the substrate" means not merely "on an element substrate", but even "the surface of the element substrate" and "inside the element substrate near the surface". In the present disclosure, "built-in" means not merely arranging respective elements as separate members on the base surface, but integrally forming and manufacturing respective elements on an element substrate by a semiconductor circuit manufacturing process or the like.

<Outline Description of Printing Apparatus (FIGS. 1 and 2)>

Figure 1:
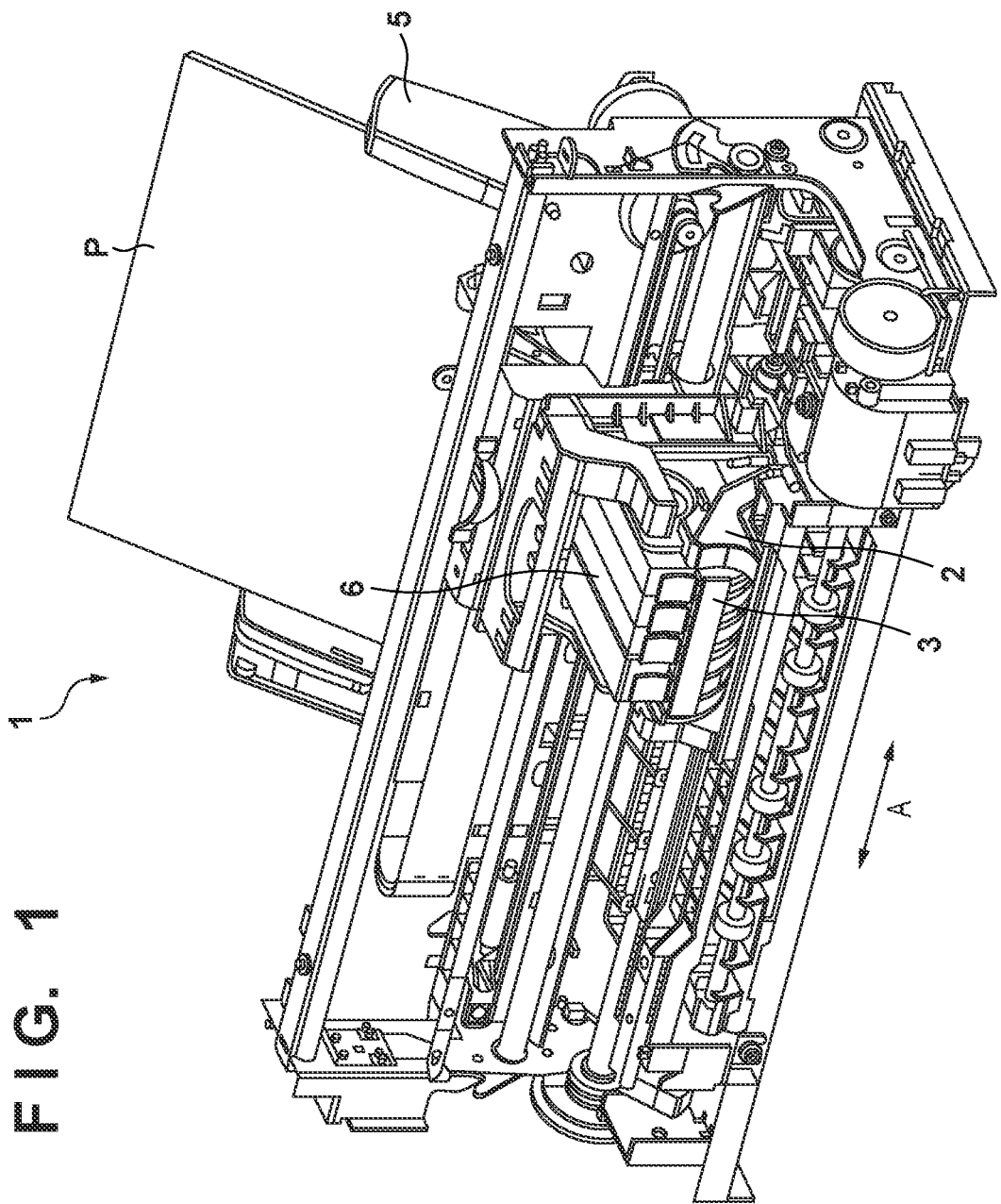
FIG. 1 is a perspective view showing the schematic configuration of a printing apparatus including a printhead as an exemplary embodiment of the present disclosure.

FIG. 1 is an external perspective view showing the outline of the configuration of a printing apparatus that performs printing using an inkjet printhead (to be referred to as a printhead hereinafter) according to an exemplary embodiment of the present disclosure.

As shown in FIG. 1, in an inkjet printing apparatus (to be referred to as a printing apparatus hereinafter) 1, an inkjet printhead (to be referred to as a printhead hereinafter) 3 which performs printing by discharging ink in accordance with an inkjet method is mounted on a carriage 2. The printing apparatus performs printing by reciprocally scanning the carriage 2 in the directions of an arrow A. Printing is performed by feeding a print medium P such as a print sheet by a sheet feeding mechanism 5, conveying the print medium P to a printing position, and discharging ink onto the print medium P from the printhead 3 in the printing position.

Not only the printhead 3 but ink tanks 6 containing inks to be supplied to the printhead 3 are also mounted on the carriage 2 of the printing apparatus 1. Each ink tank 6 is detachable from the carriage 2.

The printing apparatus 1 shown in FIG. 1 can perform color printing and four ink cartridges containing magenta (M), cyan (C), yellow (Y), and black (K), respectively, are mounted on the carriage 2. Each of these four ink cartridges is independently detachable.

The printhead 3 according to this embodiment adopts an inkjet method in which ink is discharged by using thermal energy. Hence, the printhead includes electrothermal transducers (heaters). The electrothermal transducers are arranged in correspondence with the orifices, and ink is discharged from each orifice by applying a pulse voltage to a corresponding electrothermal transducer in accordance with a print signal. Note that the printing apparatus is not limited to the serial-type printing apparatus described above, but is also applicable to a so-called full-line type printing apparatus in which a plurality of printheads (line heads) arranged with orifices in the width direction of a print medium are arranged in the conveyance direction of the print medium.

Figure 2:
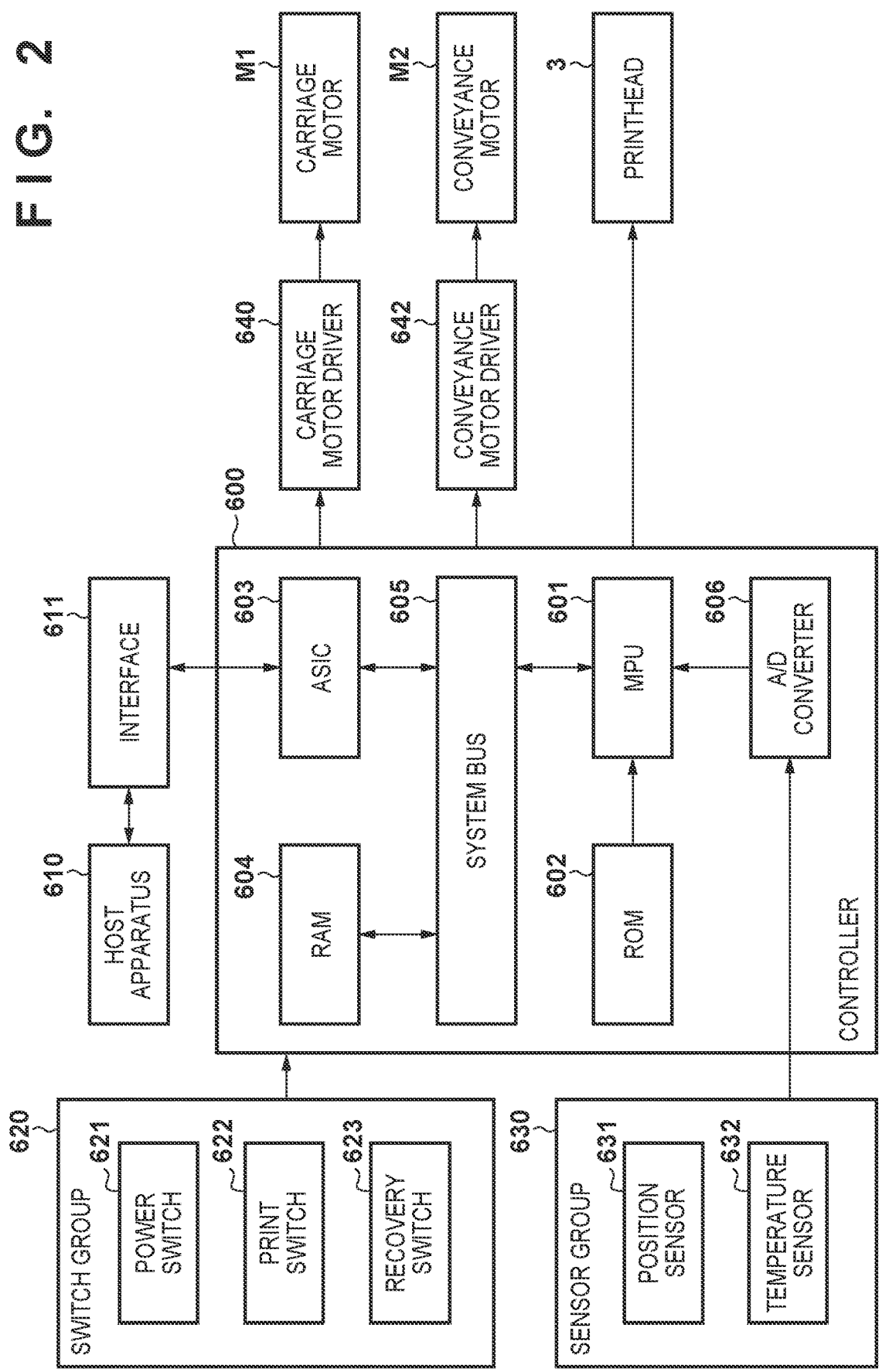
FIG. 2 is a block diagram showing the control configuration of the printing apparatus shown in FIG. 1.

FIG. 2 is a block diagram showing the control configuration of the printing apparatus shown in FIG. 1.

As shown in FIG. 2, a controller 600 is formed by an MPU 601, a ROM 602, an application-specific integrated circuit (ASIC) 603, a RAM 604, a system bus 605, and an A/D converter 606. In this case, the ROM 602 stores programs corresponding to control sequences, required tables, and other kinds of permanent data. The ASIC 603 generates control signals for controlling a carriage motor M1, a conveyance motor M2, and the printhead 3. The RAM 604 is used as an area for loading image data, a work area for executing a program, and the like. The system bus 605 exchanges data by mutually connecting the MPU 601, the ASIC 603, and the RAM 604. The A/D converter 606 receives analog signals from sensors (to be described hereinafter), performs A/D conversion on the analog signals, and supplies digital signals to the MPU 601.

In addition, in FIG. 2, reference numeral 610 denotes a host apparatus corresponding to a host or an MFP that serves as an image data supply source shown in FIG. 1. Image data, a command, a status, and the like are exchanged between the host apparatus 610 and the printing apparatus 1 via an interface (I/F) 611 by packet communication. Note that a USB interface which is separate from a network interface may be further included as the interface 611 so that bit data and raster data serially transferred from the host apparatus may be received.

In addition, reference numeral 620 denotes switches, and these switches are formed from a power supply switch 621, a print switch 622, a recovery switch 623, and the like.

Reference numeral 630 denotes sensors for detecting the state of the apparatus, and these sensors are formed from a position sensor 631, a temperature sensor 632, and the like. In addition to these sensors, a photosensor that detects the remaining ink amount is also arranged in this embodiment.

Furthermore, reference numeral 640 denotes a carriage motor driver that drives the carriage motor M1 for reciprocally scanning the carriage 2 in the directions of the arrow A, and reference numeral 642 denotes a conveyance motor driver that drives the conveyance motor M2 for conveying the print medium P.

When a print scan operation is to be performed by the printhead 3, the ASIC 603 directly accesses the storage area of the RAM 604 to transfer data for driving the electrothermal transducers (ink discharge heaters) to the printhead. In addition, this printing apparatus includes a display unit formed by an LCD, an LED, and the like to serve as a user interface.

Figure 3:
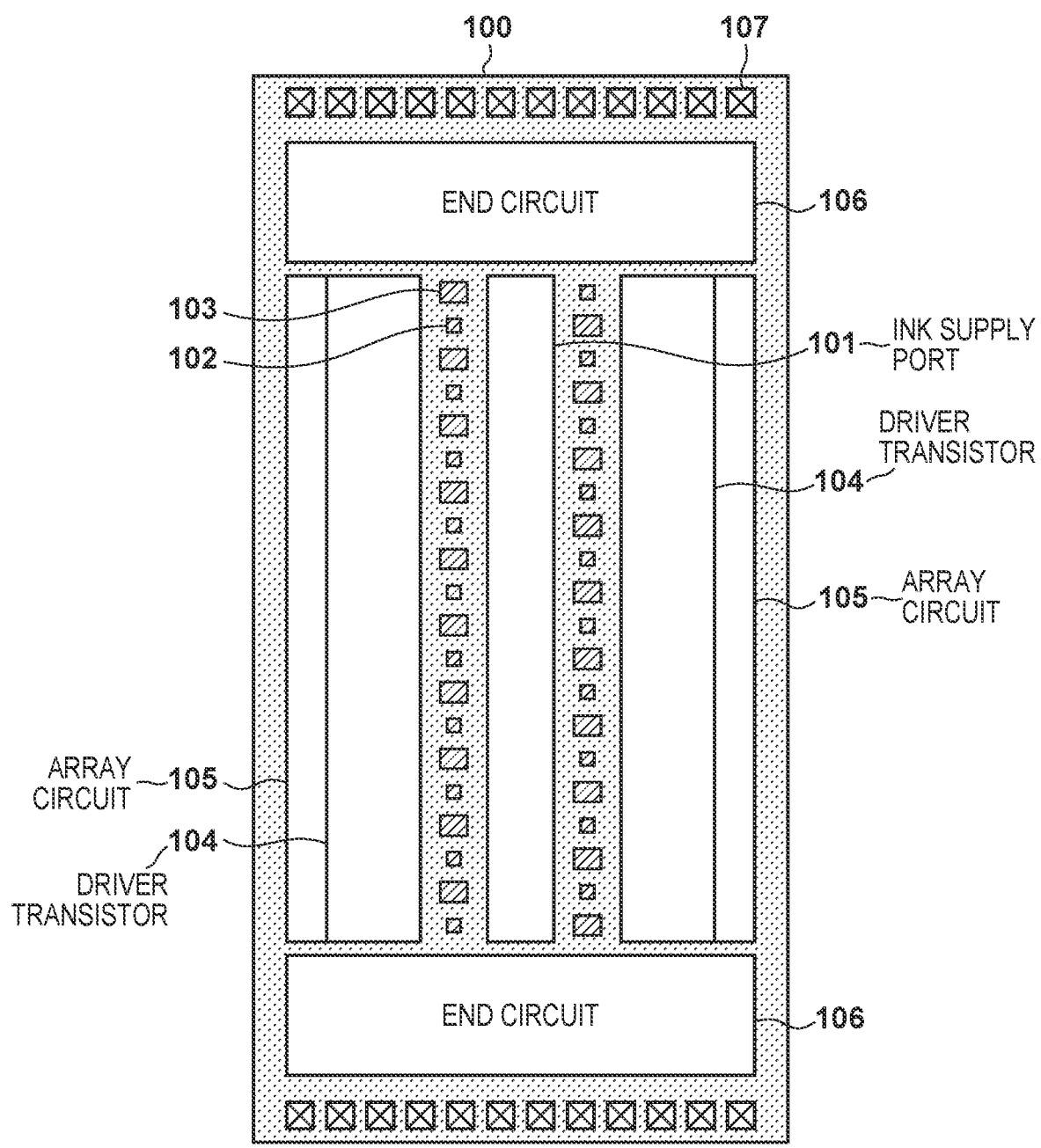
FIG. 3 is a view showing the layout configuration of an element substrate (head substrate) to be integrated on the printhead.

FIG. 3 is a view showing the layout configuration of an element substrate (head substrate) to be integrated in the printhead.

As shown in FIG. 3, a head substrate 100 includes one ink supply port 101. On the other hand, as described above, the printhead 3 performs color printing by discharging inks of magenta (M), cyan (C), yellow (Y), and black (K). Hence, these four color inks are supplied to the printhead 3. Accordingly, the printhead 3 has a configuration in which four color inks are supplied by integrating four head substrates 100, each of which is arranged as that shown in FIG. 3. Since the four head substrates 100 are arranged in a similar manner to each other, only one head substrate will be described hereinafter.

A plurality of orifices for discharging ink are formed in an array in the printhead 3. Also, in each orifice, a heater (discharge heater) 102 to be used for discharging ink and a heater (pump heater) 103 for circulating ink in each fluid channel between the ink supply port 101 and a corresponding orifice are arranged. In this manner, two kinds of heaters are arranged alternatingly along the array direction of the plurality of orifices in the printhead 3.

In the head substrate 100, a power supply, a heater driving signal, heater selection data, and the like are supplied from the main body unit of the printing apparatus 1 via the carriage 2 by pads 107, and each received signal is supplied to each end circuit 106. Subsequently, each signal is allotted between circuit arrays 105 to drive any desired driver transistor 104 to cause the ink to bubble by driving and heating the pump heaters 103 or the discharge heaters 102.

Figure 4A:
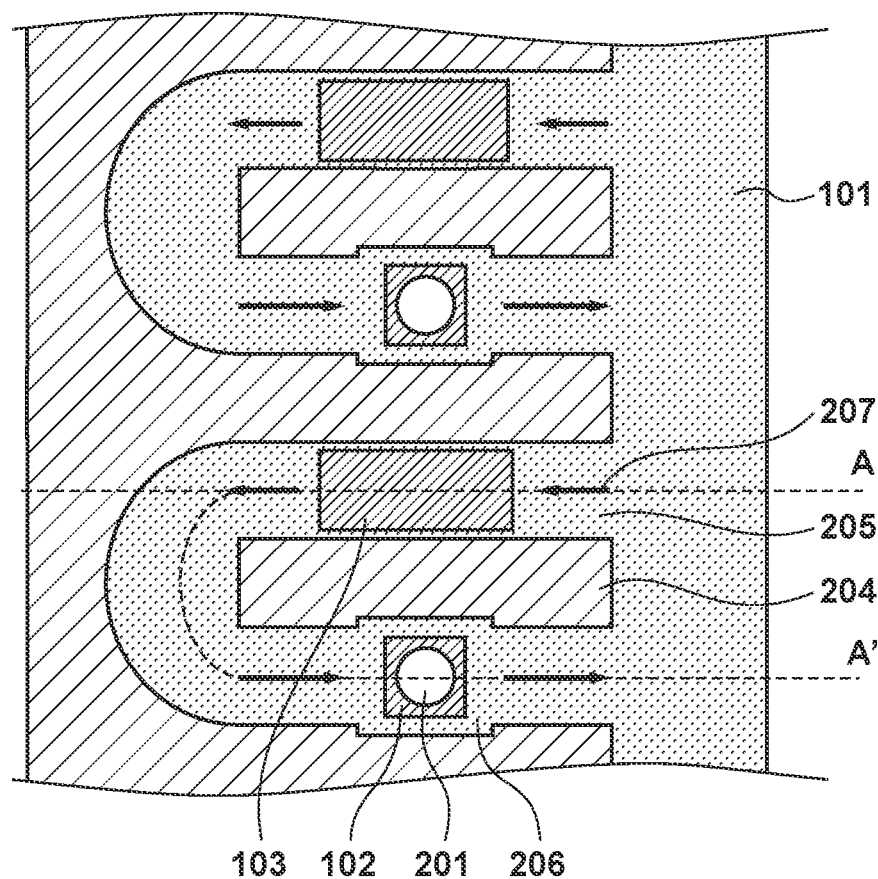
FIGS. 4A and 4B are views showing an ink circulation configuration of ink that flows through each fluid channel formed between an ink supply port and each orifice.
Figure 4B:
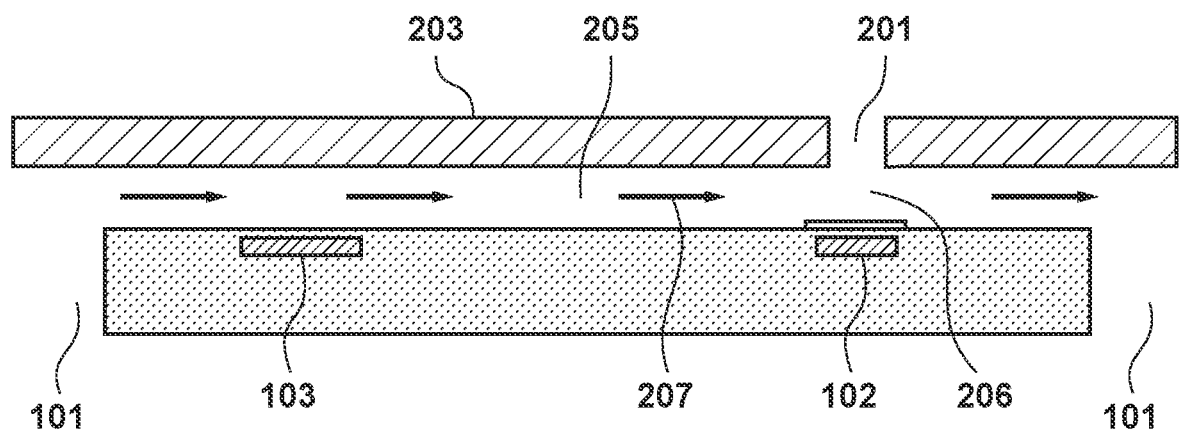

FIGS. 4A and 4B are views showing an ink circulation configuration of ink that flows through each fluid channel formed between an ink supply port and each orifice. FIG. 4A is an enlarged view of the periphery in which the discharge heaters 102 and the pump heaters 103 are arranged, and FIG. 4B is a sectional view taken along a line A-A' in FIG. 4A.

As shown in FIG. 4A, each ink channel 205 makes a 180-degree turn in the middle, and both ends of the ink channel 205 are connected to the ink supply port 101. That is, it is configured so that the ink supplied from the ink supply port 101 will flow in an ink circulation direction indicated by arrows 207 and return again to the ink supply port 101 via the ink channel 205 and a bubble chamber 206. An ink channel barrier 204 divides each ink channel 205 into a portion in which the ink flows in from the ink supply port 101 and a portion in which the ink returns to the ink supply port 101.

As shown in FIG. 4B, an orifice 201 is formed in an orifice place 203 which covers the head substrate.

Each of the pump heaters 103 which has an area size larger than that of the corresponding discharge heater 102 is arranged on the head substrate 100 so that ink condensed by the evaporation that occurred in the orifice 201 in the bubble chamber 206 can be refreshed reliably. When bubbling by the pump heater 103 occurs, the bubble expands largely to the side of the ink supply port 101 which has a low fluid resistance. Subsequently, the condensed ink in the orifice 201 and the bubble chamber 206 are refreshed by taking in a large amount of ink, as the bubble disappears, from the side of the ink supply port 101 which has a low fluid resistance to the pump heater 103 to generate a flow in the direction indicated by the arrows 207.

Ink discharge failure, density unevenness due to condensation of ink, and the like can be resolved by such a configuration as described above.

Several embodiments concerning the element substrate (head substrate) to be integrated in the printhead to be mounted in the printing apparatus according to the aforementioned configuration will be described next.

First Embodiment

Figure 6:
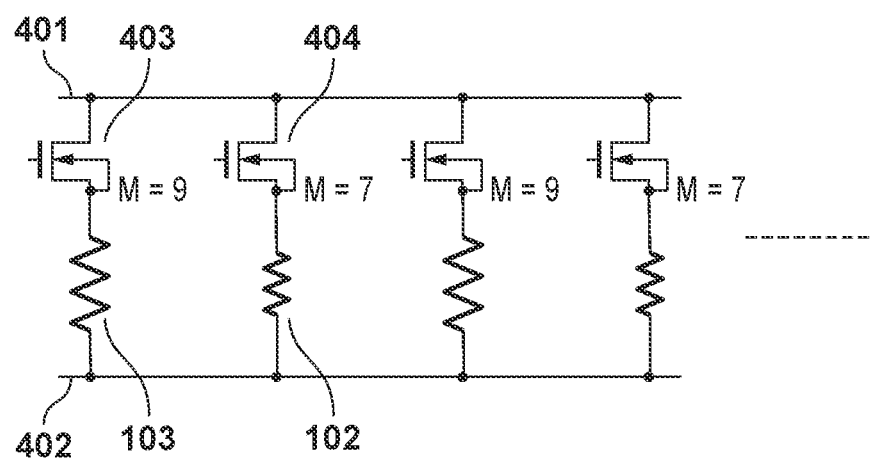
FIG. 6 is an equivalent circuit diagram of the portion shown in FIG. 5.

FIG. 5 is a layout view of a detailed circuit configuration of a portion of discharge heaters, pump heaters, and driver transistors according to the first embodiment of the present disclosure, and FIG. 6 is an equivalent circuit diagram of the portion shown in FIG. 5.

In this embodiment, an NDMOS is used as each driver transistor 104. As shown in FIG. 6, each NDMOS 404 and each NDMOS 403 are formed to have a source-follower connection with each discharge heater 102 and each pump heater 103, respectively. Each of the plurality of NDMOSes 403 and 404 includes a multi-finger gate and is parallel-connected to a VH power supply wiring 401 and a GND power supply wiring 402. In addition, the multi-finger count (finger count) of the NDMOS 403 connected to each pump heater 103 which requires a large supply current is M=9, and the multi-finger count of the NDMOS 404 connected to each discharge heater 102 which requires a smaller supply current than the pump heater 103 is M=7. In this manner, the size of the multi-finger configuration NDMOS can be changed in accordance with the supply current to minimize the area of each driver transistor 104 which occupies a large area of the head substrate. As a result, this area reduction will allow the cost to be reduced.

In this embodiment, the head substrate 100 is manufactured by using a two-layer aluminum (Al) semiconductor process. The upper layer of each driver transistor 104 is covered by a GNDH power supply wiring 308 and a VH power supply wiring 309. Although it has been omitted in FIG. 5, the heaters are arranged in parallel to the corresponding driver transistor 104 as shown in FIG. 3. The VH power supply is a voltage of about 24 V to 34 V, and the GNDH power supply is 0 V. The VH power supply wiring 309 of the upper layer Al is connected to a VH wiring 301 of the lower layer Al via a through-hole 306. This wiring is a drain wiring of the NDMOSes 403 and 404, and the NDMOSes 403 and 404 are set to ON when a voltage is applied to a poly-gate wiring 302 by a signal input from a gate driving signal line 304 of the lower layer Al.

In this embodiment, the 7-finger NDMOS 404 is arranged on the side of the heaters, and the 9-finger NDMOS 403 is arranged on the far side away from the heaters. The dimension of a gate width W of each of the NDMOSes is constant, and the finger count of each of the NDMOSes is proportional to the heater current value. The source of each NDMOS is connected to the corresponding heater via a source wiring 305 of the lower layer Al, the through-hole 306, and a source wiring 307 of the upper layer Al. As described above, since each driver transistor 104 adopts a source follower configuration, it is possible to perform control so that the voltage on one side of the heaters will be a constant voltage even if the VH voltage fluctuates when the heaters are driven.

In addition, the multi-finger arrangement direction of each NDMOS is a direction that intersects with (for example, is perpendicular to) the arrangement direction of the discharge heaters and the pump heaters.

The control voltage follows the gate voltage and causes the source to generate a voltage lower than the gate voltage by $Vth+(2Id/\beta)^{0.5}$. This will allow stable energy to be applied to the heaters and improve the image quality. The other end on the opposite side of each heater is connected to the GNDH power supply wiring 308 of the upper layer Al, and this wiring is connected in common to all of the heaters in the array.

Figure 7:
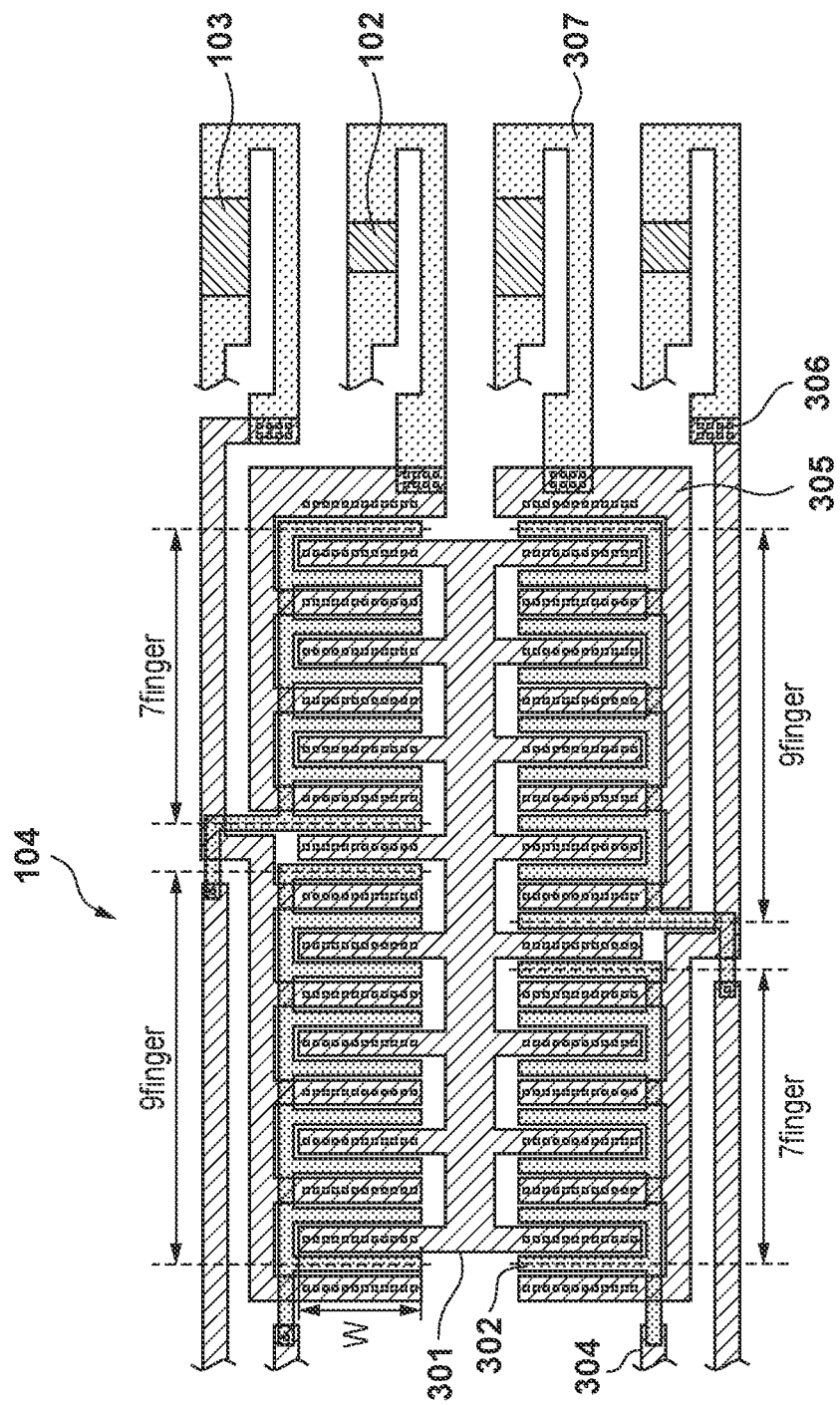
FIG. 7 is a layout view showing a detailed circuit configuration of a portion of the discharge heaters, the pump heaters, and the driver transistors according to a modification of the first embodiment of the present disclosure.

In the configuration shown in FIG. 5, each 7-finger NDMOS 404 is arranged on the side of the heater. However, as shown in FIG. 7, each 9-finger NDMOS 403 and each 7-finger NDMOS 404 may be alternately arranged on the side of the heater.

According to the embodiment described above, driver transistors of different sizes are connected to the discharge heaters and the pump heaters which required different supply currents from each other, and these driver transistors are arranged along the heater array direction so that the two different-sized driver transistors will be aligned. This can create a highly efficient layout and minimize the substrate size. As a result, the manufacturing cost of the element substrate can be reduced.

Note that although this embodiment showed an example in which the NDMOS is used as the MOSFET of each driver transistor 104, it may be formed by a PDMOS of a common source. In addition, although this embodiment showed an example in which the supply current to each pump heater 103 is larger than the supply current to each discharge heater 102, it may be set so that the supply current to each pump heater 103 will be smaller than the supply current to each discharge heater, and it is sufficient as long as the NDMOSes having sizes corresponding to the respective currents are arranged.

In addition, although this embodiment has shown an example in which each driver transistor 104 has a source-follower configuration as is obvious from FIG. 6, a common source configuration may be used. However, in such a case, the configuration will differ from that shown in FIG. 5 and will be a configuration in which the VH power supply is connected to the wiring 308, and the GNDH power supply is connected to the wiring 309.

Second Embodiment

Figure 8:
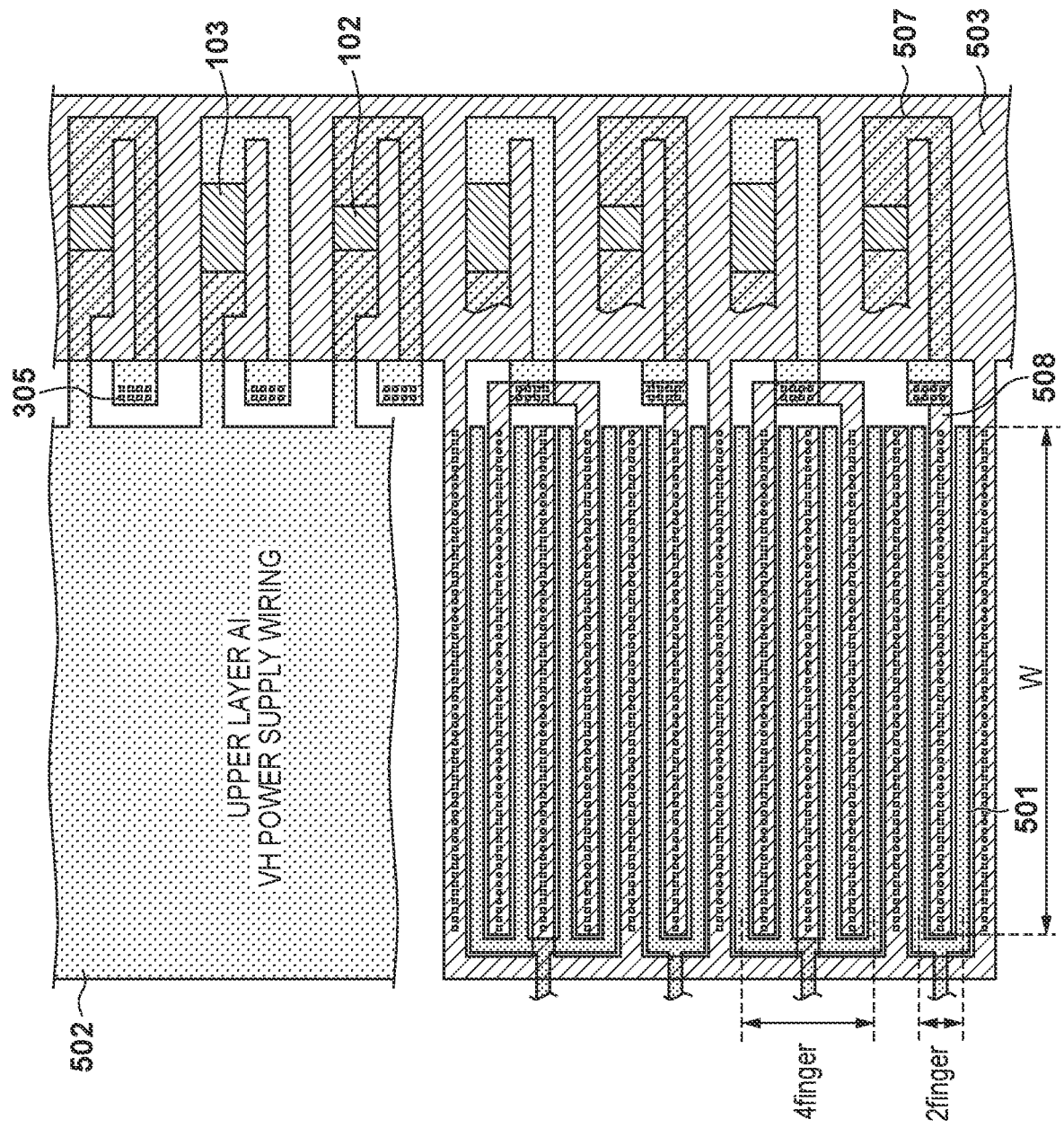
FIG. 8 is a layout view showing a detailed circuit configuration of a portion of discharge heaters, pump heaters, and driver transistors according to the second embodiment of the present disclosure.
Figure 9:
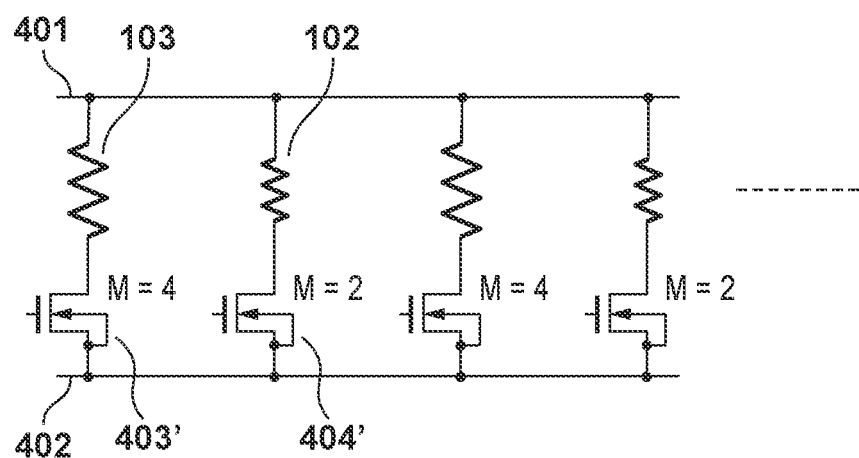
FIG. 9 is an equivalent circuit diagram of the portion shown in FIG. 8.

FIG. 8 is a layout view showing a detailed circuit configuration of a portion of discharge heaters, pump heaters, and driver transistors according to the second embodiment of the present disclosure, and FIG. 9 is an equivalent circuit diagram of the portion shown in FIG. 8. Note that in FIGS. 8 and 9, similar reference numerals will be used to denote components similar to those already described in FIGS. 5 to 7 in the first embodiment, and a description thereof will be omitted.

Although a poly-gate wiring 302 is arranged to extend in parallel to a heater array in the first embodiment, a poly-gate wiring 501 is arranged vertically with respect to a heater array in this embodiment. Each driver transistor 104 is formed by an NDMOS in a manner similar to the first embodiment and has a common source configuration as shown in FIG. 9. The multi-finger count (finger count) of each NDMOS 403' connected to a corresponding pump heater 103 is M=4, and the multi-finger count of each NDMOS 404' connected to a corresponding discharge heater 102 is M=2. The dimensions of gate widths W of these NDMOSes are equal, and only the multi-finger count will differ depending on the type (the discharge heater or the pump heater) of the heater to be connected.

In the case of this embodiment, the supply current to each pump heater 103 is twice as large as the supply current to the discharge heater 102. A VH power supply wiring 502 is arranged on an upper layer Al of each driver transistor 104. Heaters arranged in the same array are commonly connected to the VH power supply wiring 502 of the upper layer Al, and a terminal on the opposite side of each heater is connected to the drain of the corresponding NDMOS via a drain wiring 507 of the upper layer Al, a through-hole 306, and a drain wiring 508 of a lower layer Al. Each NDMOS is set to ON when the signal level of the poly-gate wiring 501 is set to Hi, and supplies a current to any desired heater. The source of each NDMOS is connected to a GNDH power supply wiring 503 of a lower layer Al arranged below the heaters.

Although the source-follower configuration of each driver transistor described in the first embodiment can suppress the voltage fluctuation on the one end of each heater and perform constant control, the voltage loss is large because of high resistance due to each transistor being driven in a saturation area. Although the voltage loss can be reduced by increasing the size of each NDMOS, this results in an increase of the area of the head substrate.

In contrast, since the common source configuration of each driver transistor adopted in this embodiment is used in a non-saturation area with low resistance, the size of each NDMOS can be made comparatively small, and the manufacturing const can be reduced. Also, since the width of all of the fingers of each NDMOS according to this embodiment matches the pitch of each heater as shown in FIG. 8, each element can be arranged with a higher layout efficiency than in the first embodiment.

Note that although this embodiment showed an example in which the NDMOS serving as the driver transistor has a common source configuration, a PDMOS source-follower configuration may be adopted. Alternatively, a source-follower configuration according to the first embodiment may also be adopted. In such a case, in the circuit diagram, the VH power supply will be connected to the wiring 503, and the GNDH power supply will be connected to the wiring 502.

In addition, although this embodiment showed an example in which the supply current to each pump heater 103 is larger than the supply current to each discharge heater 102, it may be set so that the supply current to the pump heater 103 will be smaller than the supply current to each discharge heater 102, and it is sufficient as long as the NDMOSes having sizes corresponding to the respective currents are arranged.

Third Embodiment

Figure 10:
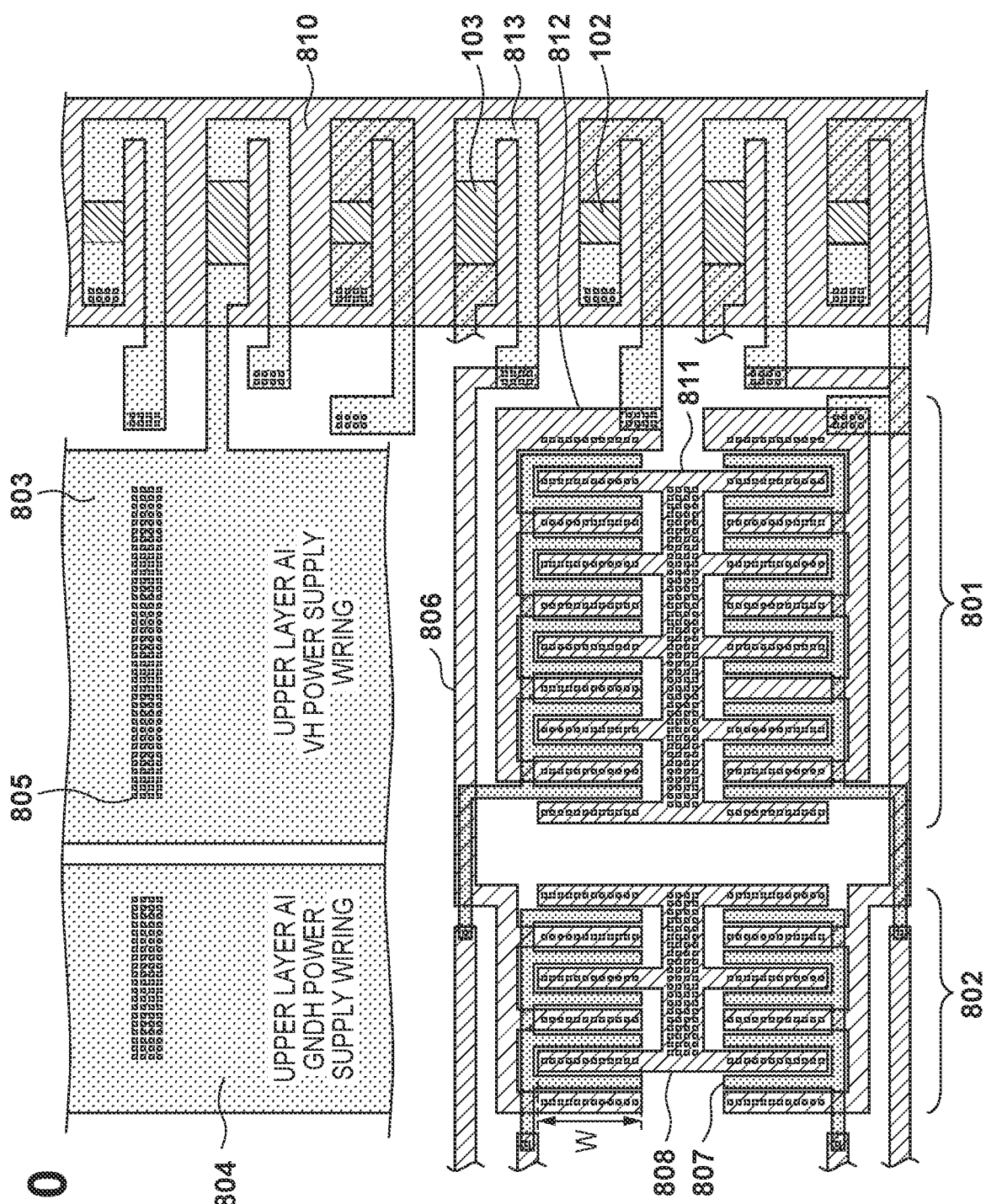
FIG. 10 is a layout view showing a detailed circuit configuration of a portion of discharge heaters, pump heaters, and driver transistors according to the third embodiment of the present disclosure.
Figure 11:
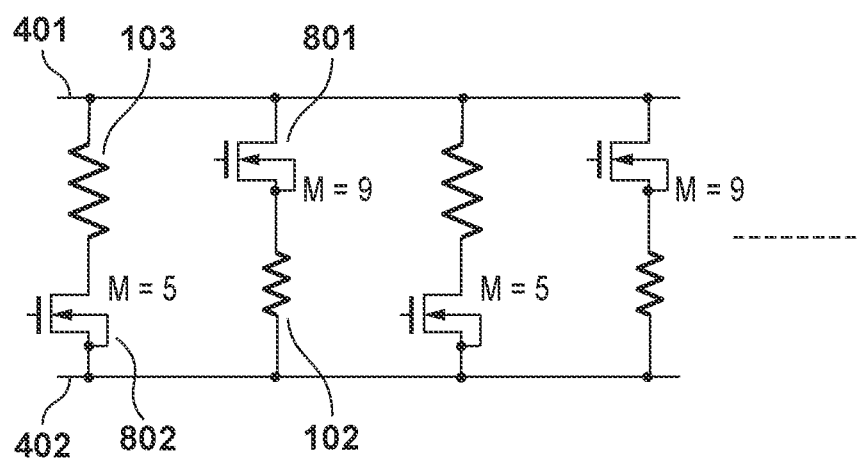
FIG. 11 is an equivalent circuit diagram of the portion shown in FIG. 10.

FIG. 10 is a layout view showing a detailed circuit configuration of a portion of discharge heaters, pump heaters, and driver transistors according to the third embodiment of the present disclosure, and FIG. 11 is an equivalent circuit diagram of the portion shown in FIG. 10. Note that in FIGS. 10 and 11, similar reference numerals will be used to denote components similar to those already described in FIGS. 5 to 7 in the first embodiment, and a description thereof will be omitted.

In this embodiment, an NDMOS 802 having a common source configuration and an NDMOS 801 having a source-follower configuration are connected to each pump heater 103 and each discharge heater 102, respectively. As described above, since a source follower configuration will not be influenced by the VH voltage fluctuation and is controlled to have a constant voltage, the source follower will be connected to each discharge heater 102 to improve the image quality. On the other hand, for each pump heater 103, the ink circulation amount is increased to make ink fresh if bubbles can be formed as largely as possible, and this can improve the printing quality. Hence, this embodiment adopts a common source configuration that can apply energy to each pump heater 103 while suppressing a VH voltage loss as much as possible.

A VH power supply wiring 803 of an upper layer Al is connected to each source-follower NDMOS 801 positioned immediately below, and is connected to the corresponding discharge heater 102 via a VH power supply wiring 811 of a lower layer Al, a through-hole 805, and a VH power supply wiring 812 of the upper layer Al. The other end of each discharge heater 102 is connected to GNDH power supply wiring 810 of the lower layer Al positioned immediately below via the through-hole 805. On the other hand, each pump heater 103 is connected to the VH power supply wiring 803 of the upper layer Al, and is connected to the corresponding common source NDMOS 802 via a drain wiring 813 of the upper layer Al, the through-hole 805, and a drain wiring 806 of the lower layer Al. A GNDH power supply wiring 808 of the lower layer Al which is the source of each NDMOS 802 is connected to a GNDH power supply wiring 804 of the upper layer Al positioned immediately above via the through-hole 805.

The dimensions of gate widths W of each common source NDMOS 802 and each source-follower NDMOS 801 are equal, and the NDMOS 802 and the NDMOS 801 have different the multiple-finger counts (finger counts). In this embodiment, the multiple-finger count of each source-follower connected NDMOS 801, which has a large voltage loss, is higher than the multiple-finger count of each common-source connected NDMOS 802.

In addition, a poly-gate wiring 807 is arranged to extend in parallel to the heater array in this embodiment.

Therefore, according to the embodiment described above, the image quality can be improved because the voltage can be controlled to be constant without receiving the influence of the VH voltage fluctuation since each discharge heater is connected to the corresponding driver transistor by a source-follower configuration. In addition, by connecting each pump heater to the corresponding driver transistor by a common source configuration, the VH voltage loss can be suppressed, the ink circulation amount can be increased by each pump heater, and a fresh ink state can be maintained.

Note that although this embodiment showed an example in which the NDMOS 802 having the common source configuration and the NDMOS 801 having the source-follower configuration are connected to each pump heater 103 and each discharge heater 102, respectively, the present disclosure is not limited to this. For example, the NDMOS 801 having the source-follower configuration may be connected to each pump heater 103, and the NDMOS 802 having the common source configuration may be connected to each discharge heater 102.

Note that although a printhead that discharges ink and the corresponding printing apparatus were exemplified in each embodiment described above, the present disclosure is not limited to this. The present disclosure is applicable to apparatuses such as a printer, a copying machine, a facsimile apparatus which has a communication system, a word processor which has a printer unit, and an industrial-purpose printing apparatus integrally combining various kinds of processing apparatuses. Furthermore, the present disclosure can be also used, for example, for the purposes of biochip manufacturing, electronic circuit printing, color filter manufacturing, and the like.

The printhead described in each of the above embodiments can also be generally referred to as a liquid discharge head. In addition, material to be discharged from the printhead is not limited to ink and can be referred to as a liquid in general. Furthermore, although it has been assumed that the printhead has an ink circulation function in the above description, the printhead can be described to have a liquid circulation function in general.

The present disclosure is not limited to the above-described embodiments, and various changes and modifications can be made within the spirit and scope of the present disclosure. Therefore, to publicly apprise the scope of the present disclosure, the following claims are appended.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-237621, filed Dec. 19, 2018, which is hereby incorporated by reference herein in its entirety.

What is claimed is:
1. An element substrate comprising:
a plurality of first heaters arrayed in a predetermined direction;
a plurality of second heaters arranged alternatingly with the plurality of first heaters, along in the predetermined direction of the plurality of first heaters;
a plurality of first driver transistors configured to drive the plurality of first heaters; and
a plurality of second driver transistors configured to drive the plurality of second heaters, wherein each of the plurality of first heaters and each of the plurality of second driver transistors have multi-finger configurations, gate widths of the multi-finger configurations are equal to each other, and a number of fingers forming each of the plurality of first driver transistor is different from a number of fingers forming each of the plurality of second driver transistor.

2. The element substrate according to claim 1, wherein a size of the first heater and a size of the second heater are different from each other, and a supply current from the first driver transistor to the first heater and a supply current from the second driver transistor to the second heater are different from each other.

3. The element substrate according to claim 2, wherein each of the first driver transistor and the second driver transistor is a MOSFET.

4. The element substrate according to claim 3, wherein the first heater and the second heater are source-follower connected to the first driver transistor and the second driver transistor, respectively, each of the first driver transistor and the second driver transistor is an NDMOS, and an array direction of multi-fingers of the first driver transistor and an array direction of multi-fingers of the second driver transistor are directions that intersect with the array direction of the plurality of first heaters and the array direction of the plurality of second heaters, respectively.

5. The element substrate according to claim 3, wherein the first heater and the second heater are connected by a common source to the first driver transistor and the second driver transistor, respectively, each of the first driver transistor and the second driver transistor is a PDMOS, and an array direction of multi-fingers of the first driver transistor and an array direction of multi-fingers of the second driver transistor are directions that intersect with the array direction of the plurality of first heaters and the array direction of the plurality of second heaters, respectively.

6. The element substrate according to claim 3, wherein the first heater and the second heater are connected by a common source to the first driver transistor and the second driver transistor, respectively, each of the first driver transistor and the second driver transistor is an NDMOS, and an array direction of multi-fingers of the first driver transistor and an array direction of multi-fingers of the second driver transistor are a same direction as the array direction of the plurality of first heaters and the array direction of the plurality of second heaters, respectively.

7. The element substrate according to claim 3, wherein the first heater and the second heater are source-follower connected to the first driver transistor and the second driver transistor, respectively, each of the first driver transistor and the second driver transistor is a PDMOS, and an array direction of multi-fingers of the first driver transistor and an array direction of multi-fingers of the second driver transistor are a same direction as the array direction of the plurality of first heaters and the array direction of the plurality of second heaters, respectively.

8. The element substrate according to claim 6, wherein a width at which each of the first driver transistor and the second driver transistor is arranged is a same as a pitch at which each of the first heaters and the second heaters is arrayed.

9. The element substrate according to claim 3, wherein the first driver transistor is source-follower connected to the first heater, the second driver transistor is connected to the second heater by a common source, each of the first driver transistor and the second driver transistor is an NDMOS, and an array direction of multi-fingers of the first driver transistor and an array direction of multi-fingers of the second driver transistor are directions that intersect with the array direction of the plurality of first heaters and the array direction of the plurality of second heaters, respectively.

10. The element substrate according to claim 3, wherein the first driver transistor is connected to the first heater by a common source, the second driver transistor is source-follower connected to the second heater, each of the first driver transistor and the second driver transistor is an NDMOS, and an array direction of multi-fingers of the first driver transistor and an array direction of multi-fingers of the second driver transistor are directions that intersect with the array direction of the plurality of first heaters and the array direction of the plurality of second heaters, respectively.

11. A liquid discharge head comprising:

an element substrate;

a plurality of orifices configured to discharge a liquid;

a common supply port configured to supply the liquid to each of the plurality of orifices;

a plurality of first fluid channels provided in correspondence with the plurality of orifices and configured to take in the liquid from the common supply port;

a plurality of second fluid channels provided in correspondence with the plurality of orifices and configured to return the liquid to the common supply port, wherein the element substrate, includes a plurality of first heaters arrayed in a predetermined direction, a plurality of second heaters arranged alternatingly with the plurality of first heaters, along in the predetermined direction of the plurality of first heaters, a plurality of first driver transistors configured to drive the plurality of first heaters, and a plurality of second driver transistors configured to drive the plurality of second heaters, wherein each of the plurality of first heaters and each of the plurality of second driver transistors have multi-finger configurations, gate widths of the multi-finger configurations are equal to each other, and a number of fingers forming each of the plurality of first driver transistor is different from a number of fingers forming each of the plurality of second driver transistor, and each of the plurality of first fluid channels is arranged with a corresponding one of the plurality of first heaters, each of the plurality of second fluid channels is arranged with a corresponding one of the plurality of second heaters and a corresponding one of the plurality of orifices, and each of the plurality of second heaters is further arranged immediately below the corresponding one of the plurality of orifices, and the liquid is circulated and discharged from the plurality of orifices via the common supply port, the first fluid channels, and the second fluid channels.

12. A printing apparatus that performs printing by discharging ink from a printhead to a print medium, wherein a liquid discharge head is used as the printhead and a liquid discharged from the liquid discharge head is the ink, comprising:

a liquid discharge head, including an element substrate, a plurality of orifices configured to discharge a liquid, a common supply port configured to supply the liquid to each of the plurality of orifices, a plurality of first fluid channels provided in correspondence with the plurality of orifices and configured to take in the liquid from the common supply port, a plurality of second fluid channels provided in correspondence with the plurality of orifices and configured to return the liquid to the common supply port, wherein the element substrate, includes a plurality of first heaters arrayed in a predetermined direction, a plurality of second heaters arranged alternatingly with the plurality of first heaters, along in the predetermined direction of the plurality of first heaters, a plurality of first driver transistors configured to drive the plurality of first heaters, and a plurality of second driver transistors configured to drive the plurality of second heaters, wherein each of the plurality of first heaters and each of the plurality of second driver transistors have multi-finger configurations, wherein gate widths of the multi-finger configurations are equal to each other, wherein a number of fingers forming each of the plurality of first driver transistors is different from a number of fingers forming each of the plurality of second driver transistors, wherein each of the plurality of first fluid channels is arranged with a corresponding one of the plurality of first heaters, wherein each of the plurality of second fluid channels is arranged with a corresponding one of the plurality of second heaters and a corresponding one of the plurality of orifices, and each of the plurality of second heaters is further arranged immediately below the corresponding one of the plurality of orifices, and wherein the liquid is circulated and discharged from the plurality of orifices via the common supply port, the first fluid channels, and the second fluid channels.

13. The apparatus according to claim 12, wherein an area of the second heater is smaller than an area of the first heater.

14. The apparatus according to claim 13, wherein the ink in the first fluid channels and the second fluid channels is refreshed by causing the ink to bubble and debubble by driving the first heaters, and the ink is discharged by causing the ink to bubble by driving the second heaters.

* * * * *